(12) United States Patent
Donati et al.

(10) Patent No.: US 11,087,847 B2
(45) Date of Patent: Aug. 10, 2021

(54) PROGRAM SUSPEND-RESUME TECHNIQUES IN NON-VOLATILE STORAGE

(71) Applicant: Intel Corporation, Santa Clara, CA (US)

(72) Inventors: Giacomo Donati, Francavilla al Mare (IT); Andrea D'Alessandro, Avezzano (IT); Violante Moschiano, Bacoli (IT)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 16/287,863

(22) Filed: Feb. 27, 2019

(65) Prior Publication Data

US 2020/0273523 A1 Aug. 27, 2020

(51) Int. Cl.
| | |
|---|---|
| *G11C 16/12* | (2006.01) |
| *G06F 3/06* | (2006.01) |
| *G11C 16/04* | (2006.01) |
| *G11C 16/32* | (2006.01) |
| *G11C 16/34* | (2006.01) |
| *G11C 16/10* | (2006.01) |
| *G11C 11/56* | (2006.01) |

(52) U.S. Cl.
CPC ............ *G11C 16/12* (2013.01); *G06F 3/0604* (2013.01); *G06F 3/0634* (2013.01); *G06F 3/0679* (2013.01); *G11C 16/0483* (2013.01); *G11C 16/10* (2013.01); *G11C 16/32* (2013.01); *G11C 16/3459* (2013.01); *G11C 11/5628* (2013.01); *G11C 11/5671* (2013.01)

(58) Field of Classification Search
None
See application file for complete search history.

(56) References Cited

U.S. PATENT DOCUMENTS

| | | | |
|---|---|---|---|
| 6,930,925 B2 | 8/2005 | Guo et al. | |
| 9,251,891 B1 | 2/2016 | Hu et al. | |
| 2005/0078525 A1 | 4/2005 | Guo et al. | |
| 2018/0151237 A1 | 5/2018 | Lee et al. | |
| 2019/0057742 A1* | 2/2019 | Jeon | G11C 16/26 |
| 2019/0171360 A1* | 6/2019 | Lee | G11C 16/26 |

OTHER PUBLICATIONS

Extended European Search Report for Patent Application No. 20154192.7, dated Jul. 2, 2020, 8 pages.

* cited by examiner

*Primary Examiner* — Tan T. Nguyen
(74) *Attorney, Agent, or Firm* — Compass IP Law, PC

(57) ABSTRACT

In one example, a nonvolatile memory device, such as a NAND flash memory device, includes an array of nonvolatile memory cells. Program operations performed by the memory may be suspended (e.g., in order to service a high priority read request). The memory device includes a timer to track a duration of time the program operation is suspended. Upon program resume, the controller applies a program voltage after resume that is adjusted based on the duration of time the program operation is suspended.

20 Claims, 8 Drawing Sheets

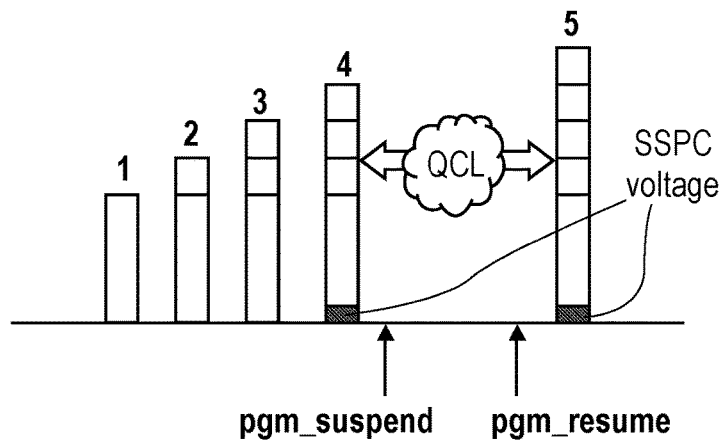
FIG. 4A
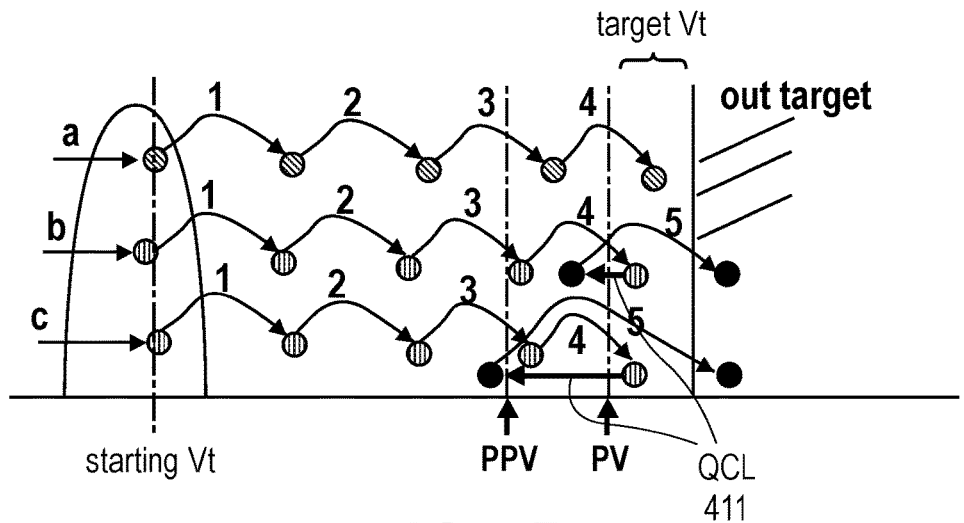
FIG. 4B
| Pulse | a | | b | | c | |
|---|---|---|---|---|---|---|
| | status | pgm step | Status | pgm step | Status | pgm step |
| 1 | pgm | 1 step | pgm | 1 step | pgm | 1 step |
| 2 | pgm | 1 step | pgm | 1 step | pgm | 1 step |
| 3 | pgm | 1 step | pgm | 1 step | pgm | 1 step |
| 4 | sspc | step/2 | sspc | step/2 | sspc | step/2 |
| | suspend - resume | | | | | |
| 5 | inhibit | | sspc | 1 step | pgm | (1+1/2)step |
FIG. 4C

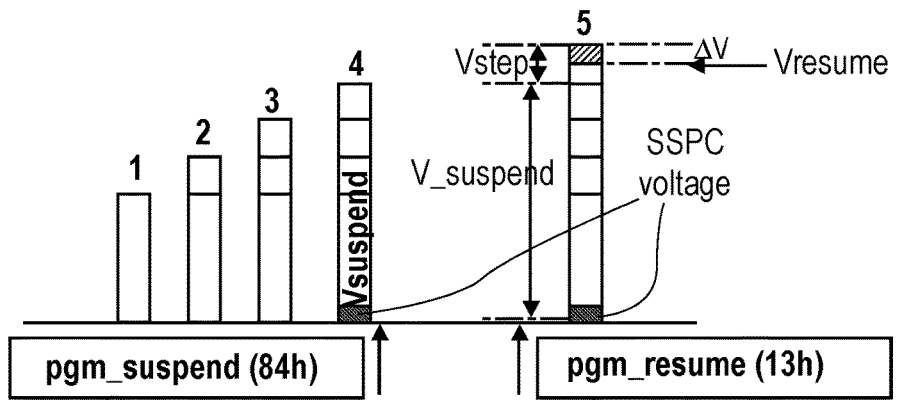
FIG. 5A
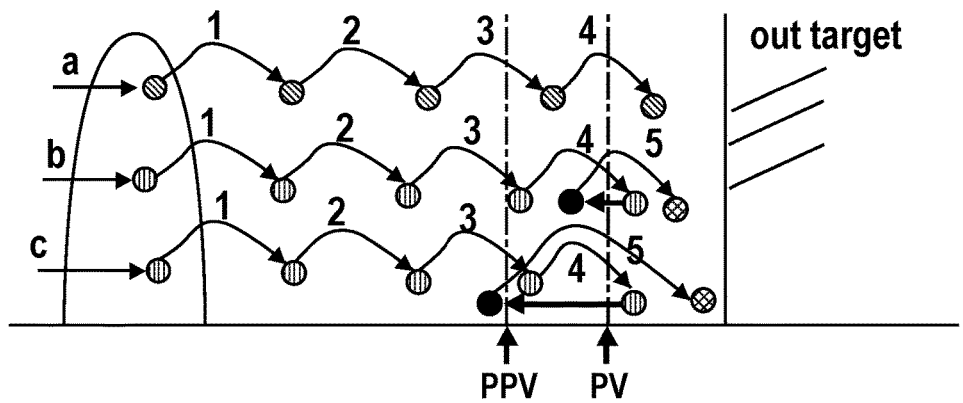
FIG. 5B
| Pulse | a | | b | | c | |
|---|---|---|---|---|---|---|
| | status | pgm step | Status | pgm step | Status | pgm step |
| 1 | pgm | 1 step | pgm | 1 step | pgm | 1 step |
| 2 | pgm | 1 step | pgm | 1 step | pgm | 1 step |
| 3 | pgm | 1 step | pgm | 1 step | pgm | 1 step |
| 4 | sspc | step/2 | sspc | step/2 | sspc | step/2 |
| | suspend - resume | | | | | |
| 5 | inhibit | | sspc | 1 step -$\Delta$V | pgm | (1+1/2)step-$\Delta$V |
FIG. 5C

PROGRAM SUSPEND-RESUME TECHNIQUES IN NON-VOLATILE STORAGE

FIELD

The descriptions are generally related to non-volatile storage media such as flash memory, and more particular descriptions are related to techniques for performing program suspend and resume operations.

BACKGROUND

Flash storage, such as NAND flash memory, is a non-volatile storage medium. Nonvolatile storage refers to storage having a state that is determinate even if power is interrupted to the device. Three dimensional (3D) NAND flash memory refers to NAND flash memory in which a NAND string may be built vertically so that FETs of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low read and write latencies, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 4A illustrates an example diagram of voltage pulses for programming a cell.

FIG. 4B illustrates threshold voltages for cells in response to the programming pulses of FIG. 4A.

FIG. 4C is a chart illustrating the cell status and program step for the program pulses of FIG. 4A.

FIG. 5A illustrates an example diagram of voltage pulses for programming a cell with a reduced program voltage upon suspend.

FIG. 5B illustrates threshold voltages for cells in response to programming pulses of FIG. 5A.

FIG. 5C is a chart illustrating the cell status and program step for the program pulses of FIG. 5A.

Descriptions of certain details and implementations follow, including a description of the figures, which may depict some or all of the embodiments described below, as well as discussing other potential embodiments or implementations of the inventive concepts presented herein.

DETAILED DESCRIPTION

Techniques for performing program suspend and resume operations are described herein.

As mentioned above, in addition to high bit density, there is demand for improvements in read and write latencies in storage devices. One way to improve read latency in NAND flash storage media is to allow for the suspension of program operations to service high priority reads. However, charge loss that occurs after the program suspend can cause issues when programming is resumed. For example, charge loss can cause a cell to appear to be in a lower voltage state, which can then cause the cells to be programmed with a voltage pulse that pushes the cell out of the target voltage range.

In one example, the storage device determines the voltage of the next program pulse after a resume command based on the duration of time a program command is suspended. By adjusting the program voltage based on the elapsed time during the program suspension, the correct magnitude for a voltage pulse can be determined to avoid pushing the cells out of the target voltage range.

Figure 1:
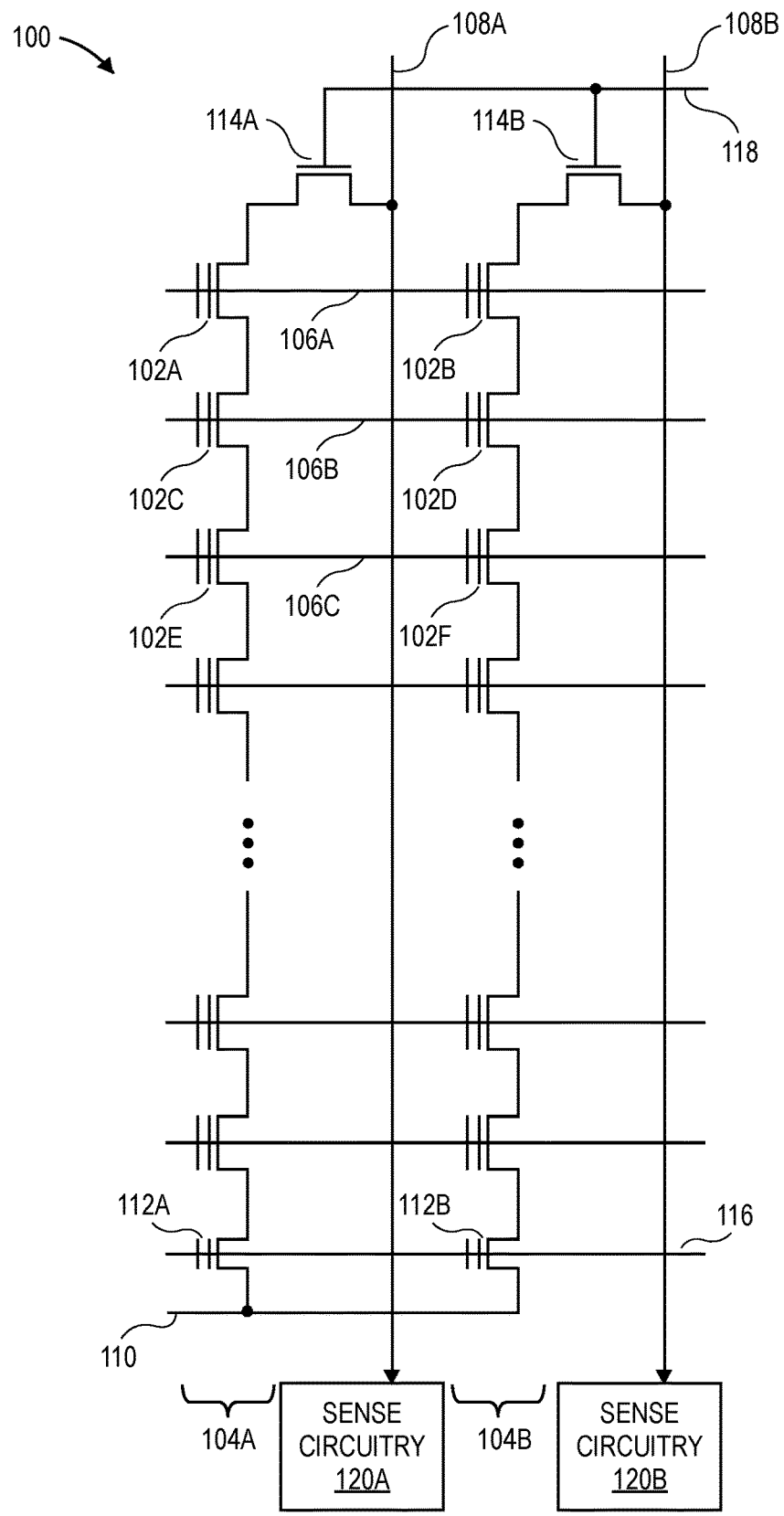
FIG. 1 depicts an example portion of a NAND flash memory array in which program suspend and resume techniques can be implemented.

FIG. 1 depicts an example portion of a NAND flash memory array 100 in which program suspend and resume techniques can be implemented. The NAND flash memory array 100 includes multiple non-volatile memory cells 102A-102F (abbreviated as 102) arranged in columns, such as series strings 104A and 104B (abbreviated as 104). In one example, the memory cell 102 includes a transistor with a replacement gate. A cell with a replacement gate typically has a low resistance gate (e.g., a tungsten gate) and a charge trap layer between the gate and the channel where charge is trapped or stored to represent one or more bit values. Replacement gate NAND cells may be susceptible to quick charge loss (QCL). Thus, distribution placement for replacement gate (RG) technology could be affected by the time between suspend and resume. In another example, a memory cell 102 can include a transistor with a floating gate (e.g., a high resistance poly gate) that stores charge indicative of one or more bit values. Other architectures are also possible. In the series strings 104, drain regions of cells 102 are (with the exception of the top cell) coupled to a source region of another cell 102.

The array 100 also includes wordlines 106A-106C. The wordlines 106A-106C can span across multiple series strings 104 (e.g., a wordline may be coupled to one memory cell of each series string 104) and are connected to the control gates of each memory cell 102 of a row of the array 100 and used to bias the control gates of the memory cells 102 in the row. The bitlines 108A and 108B (abbreviated as 108) are each coupled to a series string 104 by a drain select gate 114 and sensing circuitry 120A and 120B that detects the state of each cell by sensing voltage or current on a particular bitline 108.

Multiple series strings 104 of the memory cells are coupled to a source line 110 by a source select gate 112A and 112B (abbreviated as 112) and to an individual bitline 108 by a drain select gate 114A and 114B (abbreviated as 114). The source select gates 112 are controlled by a source select gate control line 116 and the drain select gates 114 are controlled by a drain select gate control line 118.

Figure 2:
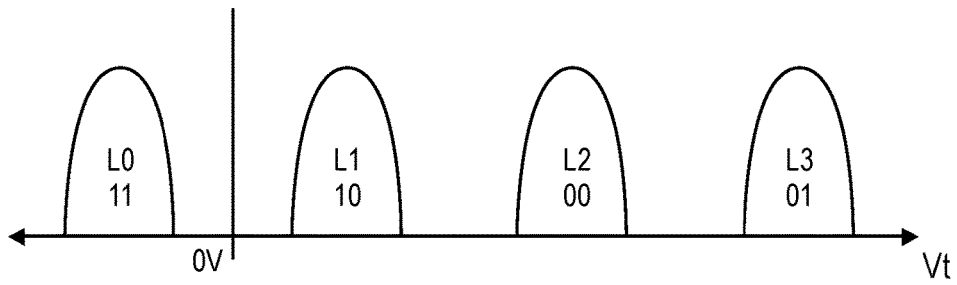
FIG. 2 illustrates an example of threshold voltage distributions for a NAND flash cell.

In some examples, each memory cell 102 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell. For example, FIG. 2 illustrates an example of threshold voltage distributions for a cell with four levels or states. Level 0 (L0) corresponds to an erase state of 11, level 1 (L1) corresponds to a first program level of 10, Level 2 (L2) corresponds to a second program level of 00, and Level 3 (L3) correspond to a program level of 01. Thus, the example in FIG. 2 is for a multi-level cell that can store 2 bits of data.

In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell may include changing the voltage difference between a control gate and a channel of the cell in order to change the threshold voltage of the cell. Accordingly, a voltage of a wordline (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 3:
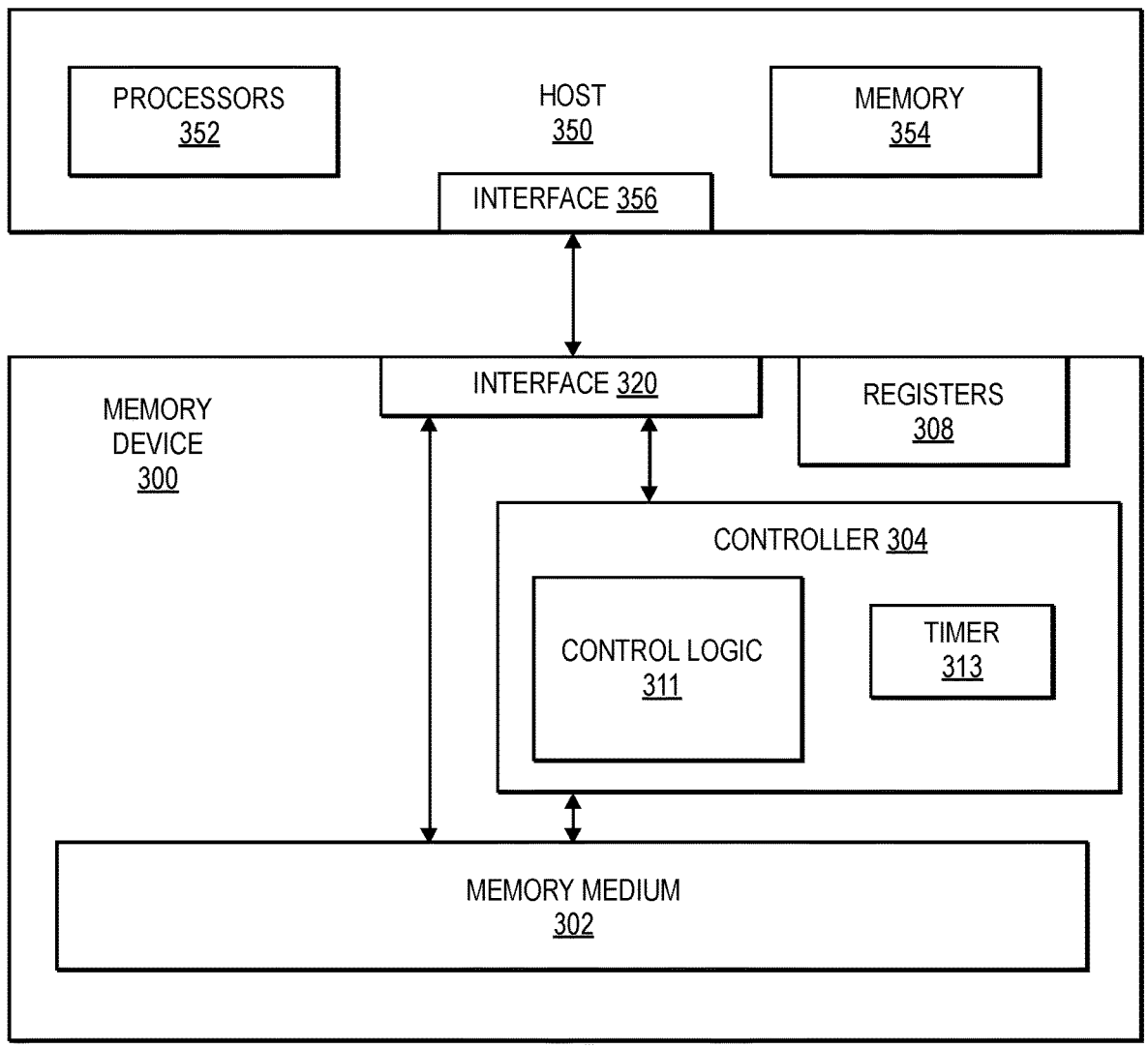
FIG. 3 depicts an example system.

FIG. 3 depicts an example system. The system includes a host 350 and a memory device 300. The host 350 and memory device 300 can be an example of a system that exists within the confines of a computer's package (e.g., within a laptop/notebook, server, or other computer). In other examples, the memory device 300 may also be accessed via a larger network such as a local area network (e.g., an Ethernet network), or a wide area network (such as a wireless cellular network, the Internet, etc.). The host 350 includes one or more processors 352, memory 354, and other components that are omitted from the drawing for clarity.

The memory device includes a memory medium 302 for storing data. Memory medium 302 can be a memory or storage medium that can store one or more bits in one or more memory cells. For example, the memory medium 302 can include non-volatile and/or volatile types of memory. In one example, the memory medium 302 includes a NAND flash memory array such as the array in FIG. 1. In some examples, the memory medium 302 can include block addressable memory devices, such as NAND technologies. The memory medium 302 can also include non-volatile types of memory, such as 3D crosspoint memory (3DxP), or other byte addressable non-volatile memory. Other technologies, such as some NOR flash memory, may be byte addressable for reads and/or writes, and block addressable for erases. The memory medium 302 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 302 can include a single-level cell (SLC) NAND storage device, a multi-level cell (MLC) NAND storage device, triple-level cell (TLC) NAND storage device, quad-level cell (QLC) storage device.

According to some examples, volatile types of memory included in the memory medium 302 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

The memory device 300 can communicate with a host system 350 using respective interfaces 320 and 356. In one example, the interface 356 is a part of a peripheral control hub (PCH). In the illustrated example, the controller 304 is coupled with a computing platform such as host 350 using the interface 320. In one example, the interface is compliant with a standard such as PCI Express (PCIe), serial advanced technology attachment (ATA), a parallel ATA, universal serial bus (USB), or other interface protocol. The controller 304 can communicate with elements of the computing platform to read data from memory medium 302 or write data to memory medium 302.

Controller 304 can be configured to receive and perform commands from host 350 concerning use of memory medium 302 (e.g., to read data, write, or erase data). The controller can be implemented with hardware (e.g., logic circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.). The memory device typically also includes memory coupled to the logic circuitry which can be used to cache NVM data and store firmware executed by the controller.

The controller 304 is coupled with the memory medium 302 to control or command the memory to cause operations to occur (e.g., read, program, erase, suspend, resume, and other operations). Communication between the memory medium 302 and the controller 304 may include the writing to and/or reading from specific registers (e.g., registers 308). Such registers may reside in the controller 304, in the memory medium 302, or external to the controller 304 and the memory medium 302. Registers or memory within the memory medium 302 may be reachable by the controller 304 by, e.g., an internal interface of the memory device 300 that exists between the controller 304 and memory medium 302 (e.g., an Open NAND Flash Interface (ONFI) interface, a proprietary interface, or other interface) to communicatively couple the controller 304 and memory medium 302.

The controller 304 can be coupled to word lines of memory medium 302 to select one of the word lines, apply read voltages, apply program voltages combined with bit line potential levels, or apply erase voltages. The controller 304 can be coupled to bit lines of memory medium 302 to read data stored in the memory cells, determine a state of the memory cells during a program operation, and control potential levels of the bit lines to promote or inhibit programming and erasing. Other circuitry can be used for applying selected read voltages and other signals to memory medium 302.

The control logic 311 can also include logic to determine what voltage to apply to resume programming after a suspend. In one such example, the control logic 311 receives a signal from a timer 313 indicating the duration of time an operation was suspended (e.g., the time elapsed between a suspend and resume command). The control logic 311 can then determine the appropriate program voltage based on the signal received from the timer. For example, the control logic 311 can adjust or reduce the program voltage that would have conventionally been applied to the cells after a suspend and resume. Note that "based on" means "based at least in part on." The program voltage can be based on one or more other factors other than the delay time. For example, the program voltage can also be based on the determined state of the cells to be programmed, and/or other factors.

FIG. 4A illustrates a diagram of voltage pulses for programming a cell, including a break in the programming pulses due to a suspend command.

As mentioned briefly above, program suspend commands (e.g., a command given by 84*h*) can enable a reduction in read latency. In memory devices without a program suspend feature, a read command issued after a program command can get stuck waiting for the program command to complete. Program operations can be time consuming and waiting until the program operation completes can significantly increase read latency.

The program suspend command can be used to pause a program algorithm in execution to serve a high priority read command. After the read is serviced, the program operation can resume. In one example, the program resume starts with a verify command to determine what state the cells are in. Based on the state of the cells, it can be determined whether another program voltage pulse should be applied to the cell, and if so, what the next program voltage should be. However, while the program operation is suspended, some memory cells may experience quick charge loss (QCL). When a verify operation is performed on a cell that has experienced charge loss, the cell may appear to be in a different state than it was at the time of the suspend operation. The incorrect determination of cell state can cause the next applied voltage pulse to push the cell out of the target voltage range.

For example, FIG. 4B illustrates three scenarios illustrating what can happen during a program suspend. Note that the scenarios illustrated in FIG. 4B are examples and are not intended to illustrate all possible outcomes of a program suspend.

FIG. 4B illustrates three cells that exhibit an initial threshold voltage (starting Vt) prior to programming. In one example, the starting threshold voltage is within the distribution of threshold voltages indicative of the reset state. The cells then receive four program voltage pulses (1, 2, 3, and 4). After the third program pulse, the cells are approaching the target voltage. In one example, as the cells approach the target state, a technique called selective slow program convergence (SSPC) may be used to avoid overshooting the target voltage and improve Vt distribution width. In SSPC, once a cell reaches some particular threshold voltage, a small voltage may be applied to the bitline of the cell to slow down the increase of Vt during the final one or more program pulses. For example, after the third program pulse, the cells are in an SSPC state, which can be determined by performing a pre-program verify (PPV) at a PPV voltage and a program verify (PV) at a PV voltage. Once it is determined that a cell is in an SSPC state, a small voltage is applied to the bitline to reduce the magnitude of the voltage pulse seen by the cell, as can be seen in the fourth and fifth program pulses of FIG. 4A (see, SSPC voltage of FIG. 4A). After the four program pulses, the cells are in the target threshold voltage range (target Vt).

After the fourth program pulse, the controller determines that the program operation should be suspended (e.g., due to receipt of a high priority read request). As mentioned above, while programming is suspended, some cells experience quick charge loss. When programming resumes (e.g., in response to a resume command from the controller), the controller determines where the programming operation left off. Some or all of the information to resume programming could be saved in memory. For example, the program internal status, such as the program voltage (Vpgm), the program loop, etc. can be stored by the controller. Cell information, such as the data to program, status of the cell, etc., can be stored into the page-buffer latches. The saved program internal status enables the program operation to resume correctly.

For technologies that implement SSPC, status information indicating whether the cell is in its final state (inhibit information) and information indicating that a cell is close to its final status (SSPC information) may also be needed to correctly execute a resume operation. However, storing all information needed to resume a programming operation can require additional storage elements (e.g., latches), which can impact the die size. Therefore, some information may be lost between suspend and resume commands. In one example, the controller performs a verify command to determine the status of the cell, including whether the cell is in an "inhibit" state, "SSPC" state, or other state. Thus, the SSPC information can be regenerated at program resume by performing a program verify operation before the first program pulse after resume. If the cell has not experience quick charge loss during program suspend, the verify operation will return accurate state information and the resume operation can continue where the program operation left off. However, if the cell has experienced quick charge loss, the SSPC information may be wrongly regenerated, causing the program step at resume to be larger, which can impact the read write budget (RWB) and RBER. For example, incorrectly determining the cell state can cause the resume operation to inadvertently push the cell outside of the target range. The time between suspend and resume is not typically controlled by spec, and can vary significantly (e.g., 1 ms, 1 s, 1 s, etc.). The time delay can affect the rate or degree of charge loss, which can impact the threshold voltage distribution placement and/or cause an increase in bit error rate (BER) after a program suspend. An example of this issue is illustrated in FIGS. 4B and 4C.

As can be seen in FIGS. 4B and 4C, the cells in scenarios 'a', 'b', and 'c' all receive four program pulses. Note that although only program pulses are illustrated, a verify will typically be performed after each program pulse. FIG. 4C shows that the first three pulses have the same program step (1 step). The first program pulse has a magnitude of Vpgm1=Vpgm_start. Therefore, the voltage at the gate of the cell is Vpgm_start. In this example, the voltage applied to the channel (V_channel) during the first program pulse is 0V. The second program pulse has a magnitude of Vpgm2=Vpgm_start+V_step. Thus, the difference in gate voltage between the first and second pulses is V_step. In this example, the voltage applied to the channel (V_channel) during the first program pulse is 0V. The program step (pgm_step) is defined here as the difference in the voltage applied to the gate minus the difference in voltage applied to the channel between pulses (ΔV_gate−ΔV_channel). Therefore, the program step between the first and second pulses is V_step=V_step−0.

The third program pulse has a magnitude of Vpgm3=Vpgm_start+2*V_step. Therefore, the difference in gate voltage between the second and third pulses is still V_step. In this example, 0V is applied to the channel. Therefore, the program step between the second and third pulses is again V_step=V_step−0.

In the example illustrated in FIG. 4B, after the third program pulse, the controller can perform a pre-program verify to determine if the cell is approaching its final state. In other examples, a pre-program verify may be performed at a different stage (e.g., after fewer or more than three program pulses). In one example, if the cell conducts current in response to the PPV pulse, then the cell is in the SSPC state and is approaching the final threshold voltage. In one example, after the controller determines the cell is in the SSPC state, the controller applies a small voltage (the SSPC voltage) to the bitline to decrease the program step seen by the cell. The fourth program pulse has a magnitude of Vpgm4=Vpgm_start+3* V_step. Therefore, the difference in gate voltage between the third and fourth pulses is still V_step. However, in this example, V_step/2 is applied to the channel via the bitline. Therefore, the program step for the fourth pulse is V_step/2=V_step−V_step/2. The smaller program step causes the threshold voltage of the cell to be within the target window. Thus, after the fourth program step, the threshold voltage for scenarios 'a', 'b', and 'b' are all within the target Vt distribution.

After the fourth program pulse, the memory array receives a suspend command. While programming is suspended, some cells experience quick charge loss (QCL). For example, the cells in scenarios 'b' and 'c' experience quick charge loss, as illustrated by the arrows 411 showing the reduction in threshold voltage in scenarios 'b' and 'c'. In contrast, the cell in scenario 'a' experiences no charge loss during the program suspend. The controller performs a verify command to determine the state of the cells. For scenario 'a', the controller determines the cell has the desired threshold voltage and therefore is in an "inhibit" state. When the cell is in an inhibit state, the controller (e.g., controller 304) inhibits or suppresses further programming of the cell (e.g., by applying an inhibit voltage). For scenario 'b', the controller determines the cell is in the "SSPC" state (and therefore close to the target threshold voltage). For scenario 'c', the controller determines the cell is in the "program" state. Therefore, in this example, the controller will apply a fifth program voltage pulse to the cells in scenarios 'b' and 'c'.

Referring to scenario 'b', the voltage applied to the gate would be Vpgm5=Vpgm_start+4*V_step. Therefore, the difference in gate voltage between the fourth and fifth pulses is V_step. Because the cell is in the SSPC state, the voltage applied to the channel via the bitline in this example is V_step/2. The previous voltage applied to the channel via the bitline was also V_step/2 (for the fourth program pulse), therefore, there is no change in the channel voltage. Therefore, the program step for the fifth pulse in scenario 'b' is pgm_step=ΔV_gate−ΔV_channel =V_step−0=V_step. As can be seen in FIG. 4B, the program step of V_step causes the fifth program pulse to push the cell out of the target threshold voltage range.

Referring to scenario 'c', the voltage applied to the gate would be the same as in scenario 'b': Vpgm5=Vpgm_start+4*V_step. Therefore, like in scenario 'b', the difference in gate voltage between the fourth and fifth pulses is V_step. However, unlike in scenario 'b', the controller determined that the cell is in program state in scenario 'c'. Therefore, the SSPC voltage will not be applied to the channel. Therefore, the change in the channel voltage from the fourth program pulse to the fifth program pulse is −Vstep/2. The program step for the fifth pulse in scenario 'c' is then pgm_step=ΔV_gate−ΔV_channel= V_step−(−Vstep/2)=1.5* V_step. Therefore, the program step for the fifth pulse in scenario 'c' is even larger than in scenario 'b', and the cell is pushed even further beyond the target threshold voltage range. The cells that are pushed out of the target threshold voltage range can negatively impact the distribution placement and cause an increase in bit error rate (BER).

In contrast, FIGS. 5A-5C illustrate a technique for resuming programming after a suspend with improved threshold voltage distribution placement and BER. To account for charge loss, the program step for program pulses after a resume is adjusted. In one example, the magnitude of the voltage applied to the gate is reduced by ΔV. In the example illustrated in FIG. 5A, the program voltage upon resume is given by: Vresume=Vsuspend+Vstep−ΔV.

In one example, ΔV(t) is based on the delay time 't' between the suspend command and the resume command. An internal delay counter can be used to track the suspend-resume delay. In one example, the same timer used for another function in the memory device (such as a timer in the temperature sensor) can also be used for tracking the suspend-resume time delay. In another example, a separate timer is used. In one example, the timer receives one or more signals as inputs that indicate whether a suspend or resume command has been received. The timer can then be started in response to the input signal indicating a suspend command was received and stopped in response to the input signal indicating a resume command was received. A corrective action, such as modifying the suspend-resume voltage, can compensate QCL at the resume condition.

FIG. 5B illustrates memory cells in three scenarios, like FIG. 4B, discussed above. Like in FIG. 4B, the cells in FIG. 5B are programmed with three program pulses (1, 2, and 3), at which point the cells are in an SSPC state. Once the cells are in the SSPC state, the SSPC voltage is applied to the bitline to reduce the program step seen by the cell. A suspend command is received after the fourth program pulse. Also like in FIG. 4B, the cell in scenario 'a' does not experience quick charge loss, while the cells in scenarios 'b' and 'c' do experience quick charge loss. Therefore, upon resume, the controller determines that the state of the cell in scenario 'a' is in an inhibit state, the cell in scenario 'b' is in an SSPC state, and the cell in scenario 'c' is in the program state. However, unlike in FIG. 4B where the fifth program pulse causes the cells in scenarios 'b' and 'c' to have a threshold voltage outside the target, the fifth pulse in FIG. 5B causes all three cells to be within the target threshold voltage distribution due to the smaller program step.

FIG. 5C illustrates the status and program step for each program pulse. As can be seen for the program pulse after the resume command (pulse 5), the program step for cells in the SSPC or program states are reduced by ΔV. As mentioned above, ΔV is a function of the delay time between program suspend and resume. By reducing the program step by an amount proportional to the delay time, the problem of overshooting the target threshold voltage can be avoided.

Figure 6A:
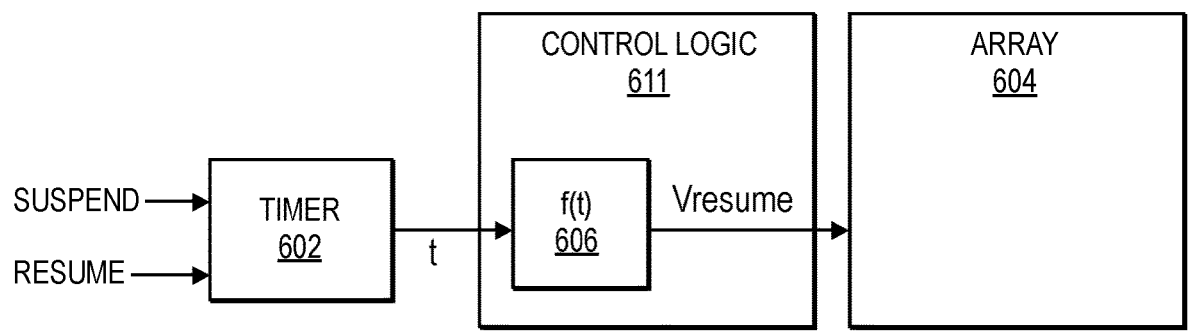
FIG. 6A illustrates a block diagram of an example of a timer and control logic.

FIG. 6A illustrates a block diagram of an example of a timer and control logic for determining the program voltage upon resume. The timer 602 includes circuitry to track elapsed time in response to one or more signals that trigger the timer to start and stop. In the example illustrated in FIG. 6A, the timer receives a "suspend" signal to trigger the timer to start and a "resume" signal to trigger the timer to stop. The suspend and resume signals can be from the control logic (e.g., control logic 611) or the memory (e.g., array 604). The triggers that causes the suspend and resume signals to be asserted can be implementation specific. For example, assertion of the suspend command (where assertion of a signal can refer to driving the signal high or low depending on how the signal is defined) can be triggered by: the control logic sending a suspend command to an array, the array receiving a suspend command, the array starting or successfully completing the suspend operation, or some other trigger. Similarly, assertion of the resume command can be triggered by: the control logic sending a resume command to an array, the array receiving a resume command, the array starting or successfully completing a resume operation, or some other trigger. The timer circuit can also include additional or different inputs, such as a reset signal to cause the timer to reset to '0'. Once the timer 602 has determined a time delay between a suspend and resume, the timer outputs the delay 't' to control logic 611.

In one example, the delay time 't' is defined as the time elapsed between assertion of the suspend signal and the resume signal. The delay time t can be measured in a unit of time such as microseconds (μs), milliseconds (ms), seconds (s), a number of clocks, or a different unit of time. In one such example, ΔV(t) has a linear relationship to the time elapsed between the suspend and resume commands such that the more time the program command is suspended, the larger ΔV is. In other examples, ΔV(t) is a nonlinear function of t.

The control logic 611 includes logic 606 to receive the input 't' and determine the program voltage Vresume after a program suspend and resume. In one example, the logic 606 includes circuitry to implement a function f(t) and output an adjusted program voltage. The function of time f(t) is based on the behavior of the memory cell technology and can be different for different technologies. Thus, the relationship between time delay and QCL can be derived for a given memory cell technology based on silicon characterizations. The logic 606 can receive additional signals, such as signal(s) indicating the state of the memory cells for which programming is to resume, signal(s) indicating the program voltage prior to adjustment based on the time delay, or other signals. The control logic 611 then applies the program voltage Vresume to the cells of the array 604 for which programming is to resume.

Figure 6B:
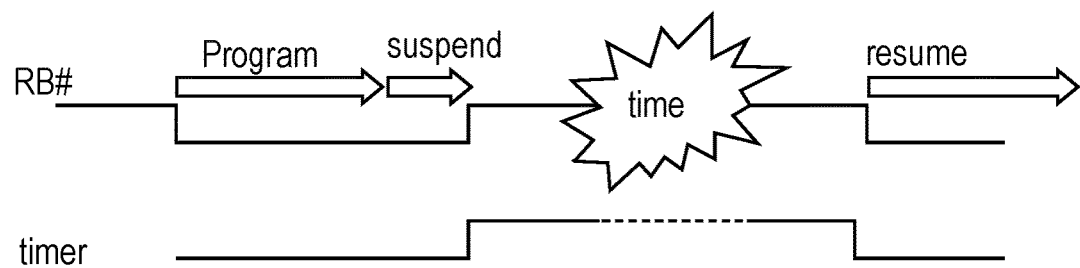
FIG. 6B illustrates a timer signal relative to program, suspend, and resume commands.

FIG. 6B illustrates a timer signal relative to program, suspend, and resume commands. When a program operation is being performed, the RB# (Ready/Busy#) output signal is low to indicate the chip is "busy" processing a program or erase operation. Referring to FIG. 3, in one example, the Ready/Busy signal is generated by the internal controller 304 and sampled by the host. In one example, the internal controller updates a register to indicate whether or not the memory medium 302 is "ready" to receive a next command. For example, if the memory medium 302 is free to accept the next command, the internal controller sets the "ready" bit of the register to a 1. By contrast, if the memory medium 302 is currently executing a command that it previously accepted from the controller 304, the memory medium's "ready" bit is a 0 and remains in that state until the executing command is completed. When the "ready" bit is 0, the controller 304 refrains from issuing a next command to the memory medium 302. The RB# signal and/or a signal from a ready/busy register can drive the RB# pin to the host. Thus, the host can determine whether the memory medium 302 is ready for the next command by reading a register (e.g., a ready/busy# register) or sampling the ready/busy# signal.

During the program operation, the controller 304 suspends the program operation. In response to suspending of the operation, the RB# signal goes high to indicate the chip is "ready" to transfer data to a data register in response to a read command. The RB# signal again transitions to a logic low in response to the resume command to indicate the chip is busy completing the program operation. In the example illustrated in FIG. 6B, the timer signal is low during the program operation, indicating the timer has not started. After the suspend command is received and as the RB# signal transitions low, the timer signal goes high, indicating the timer has started.

After the resume command is received, the timer stops. Note that although in this example, the timer signal transitions at the same time as RB#, the RB# signal is shown for reference and the timer is typically not synchronized with the RB# signal (because the RB# signal also transitions during the read operation). In one example, the timer starts with the command program suspend and the timer stops with command resume. Regardless of the exact timing of the start and stop of the timer, the timer tracks a time delay based on the suspend and resume operations.

Once the time delay is determined, the timer can then output the time delay to the control logic. The control logic then determines the appropriate program voltage upon resume based on the time delay.

Figure 7A:
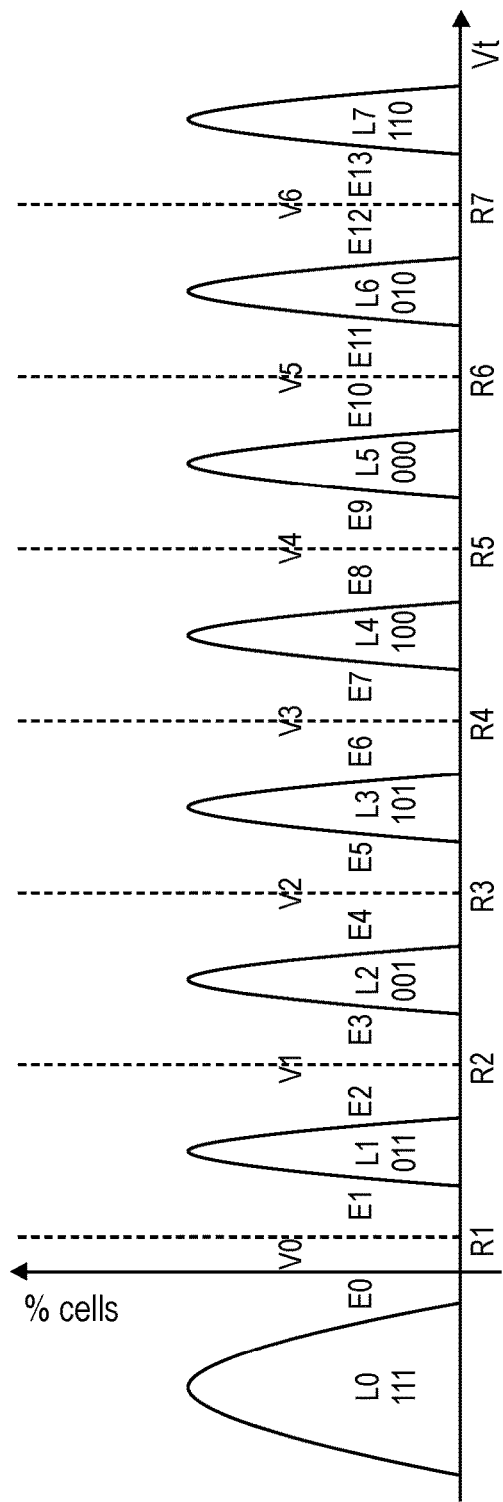
FIG. 7A illustrates an example of threshold distributions for a cell.

FIG. 7A illustrates an example of threshold distributions for a cell with eight levels or states (e.g., a TLC cell). Thus, the graph in FIG. 7A illustrates levels L0-L7. The graph also shows read reference voltages (R1-R7), which are selected to be at voltages between the distributions. Each distribution has edges. For example, the L1 distribution has an odd edge E1 and an even edge E2. The edges are impacted by both the width and placement of the threshold voltage distributions. If the edges are close to one another, there is less margin between distributions and a greater risk of errors. The location of the even edges (e.g., E0, E2, E4, E6, E8, E10, and E12) can affect the margin available for program disturb and over-programming. The odd edges (e.g., E1, E3, E5, E7, E9, E11, and E13) can affect the margin available for charge loss (e.g., quick charge loss). The sum of the edge margins is typically defined as the Read Window Budget (RWB). RWB can more generally be given by:

$$RWB = \sum_{i=1}^{n-1} |rl - Ei|$$

where n is the number of edges (e.g., FIG. 7A illustrates fourteen edges E0-E13), rl is the read reference voltage for the level nearest the edge i, and Ei is the voltage at the edge.

Conventional program-suspend operations can cause degradation of the even edges, depending of instant of suspend time. For example, as discussed above with respect to FIGS. 4A-4C, program and suspend operations can cause over-programming, which in turn affects the threshold voltage distribution edges. Degradation of the edges can then cause RWB degradation. In contrast, adjusting the resume program voltage based on the time elapsed between suspend and resume commands can significantly improve distribution edges, which in turn improves RWB.

Figure 7B:
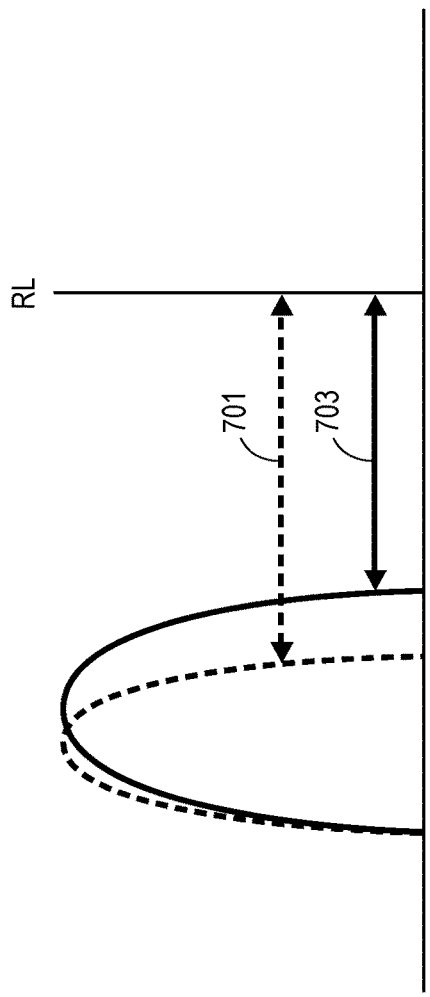
FIG. 7B shows an example of the edge placement improvement achieved by adjusting the resume program voltage.
Figure 7C:
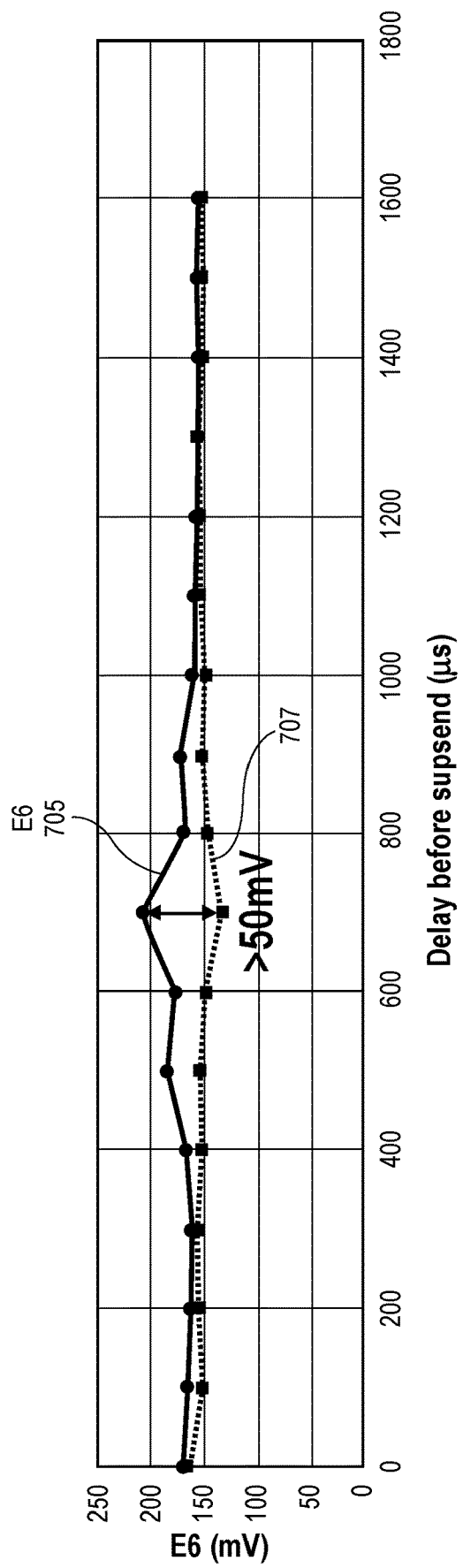
FIG. 7C illustrates a graph showing voltage threshold distribution improvement achieved by adjusting the resume program voltage.

FIG. 7B shows an example of the edge placement improvement achieved by adjusting the resume program voltage. The example in FIG. 7B illustrates the difference between the edge E6 and the read reference voltage level RL for both a conventional flash device (703) and for a flash device that adjusts the program voltage after suspend and resume based on the duration of time the command was suspended (701). As can be seen in FIG. 7B, adjusting the resume program voltage can lead to a significantly better (e.g., narrower) distribution width. FIG. 7C illustrates a graph showing the delay before the suspend command on the x-axis and the difference between the edge E6 and the read reference voltage on the y-axis. The line 707 shows the difference between E6 and the read reference voltage for a NAND flash device in which the resume program voltage is not adjusted based on the delay time. The line 705 shows the difference between E6 and the read reference voltage for a NAND flash device in which the resume program voltage is adjusted based on the delay time between suspend and resume. As can be seen in FIG. 7C, there is a greater than 50 mV improvement in the E6 edge placement. Similar improvements can be seen for the other edges of the threshold voltage distributions.

Figure 8:
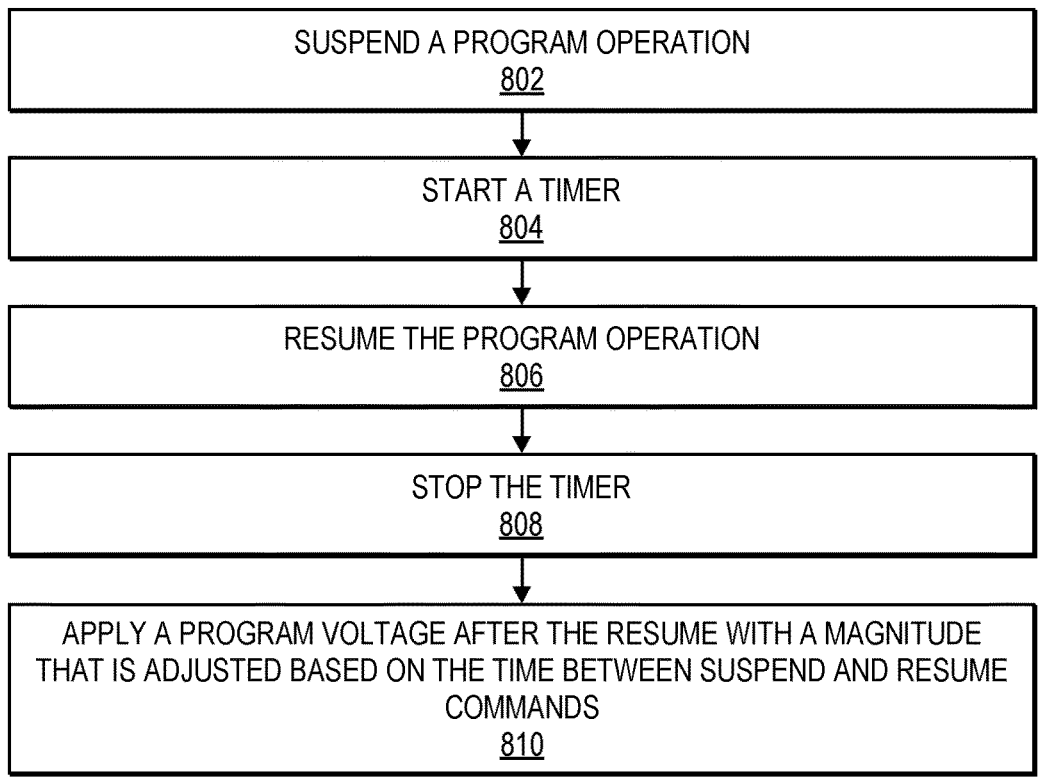
FIG. 8 is a flow chart illustrating a method of resuming programing after a suspend.

FIG. 8 is a flow chart illustrating a method of resuming programing after a suspend. The method 800 can be performed by the controller of the memory device. For example, the controller 304 of FIG. 3 can perform the operations of the method 800. Some or all operations performed by the controller 304 may be performed by the control logic 311 of the controller 304.

The method 800 begins with suspending the program operation, at operation 802. Referring again to FIG. 3, consider a scenario in which the memory medium 302 is performing a program operation (and is therefore busy, as indicated by a signal and/or register). The controller 304 receives a read command from a host. The controller determines that the program command should be suspended to allow the read to be serviced. For example, before receiving the read command, the controller 304 receives a program suspend command. In this example, the program suspend command is always accepted by the NAND flash. The determination of whether the program command should be serviced can be due to a variety of parameters, such as whether the read is "high priority" (e.g., as indicated by the host, due to the address or region of the requested data, due to performance parameters, etc.). The controller then sends a command to the memory medium 302 to indicate the program operation should be suspended. In other examples, there may not be a specific suspend command, but the memory medium is commanded via one or more signals and/or one or more other commands to suspend the program operation. Also note that although the examples are described in terms of a controller sending suspend and resume commands to a memory medium, in other examples, the memory medium includes logic to internally cause and handle suspends and resumes. For example, the memory medium can include logic that determines that a program operation should be suspended to service a high priority read. In one such example, the memory medium also includes the timer and logic to adjust the resume program voltage.

Referring again to FIG. 8, a timer is then started to track the approximate time delay of the suspended command, at operation 804. Once the controller determines that the program operation can resume (e.g., due to the completion of a read command), the program operation is resumed, at operation 806. In one example, the controller causes the program operation to resume by sending a resume command to the memory medium. The timer is stopped when the program operation is resumed, at operation 808. In one example, upon resume, the controller determines the state of the cells for which programming is to resume. Determining the state of the cells can be achieved by a verify command, which can be the first operation of a resume command or can be a command and distinct from the resume command. The program voltage is then determined based on the state of the cells for which programming is to resume. For example, referring to FIG. 5C, programming for the cell in scenario 'a' would be inhibited upon resume. The program steps for the cells in scenarios 'b' and 'c' are determined based on the state of the cell (e.g., whether the cell is in SSPC or program state).

The program voltage after resume can then be adjusted in accordance with the time delay received from the timer, at operation 810. For example, the controller can reduce the magnitude of the program voltage after a resume command based on the time elapsed between the suspend and resume commands. Referring again to FIG. 5C, the program steps for scenarios 'b' and 'c' are reduced by ΔV. Reducing the program step reduces the magnitude of the effective program voltage. By adjusting the resume program voltage based on the time elapsed between the suspend and resume commands, the threshold voltage placement and width can be improved, which in turn improves the bit error rate.

Figure 9:
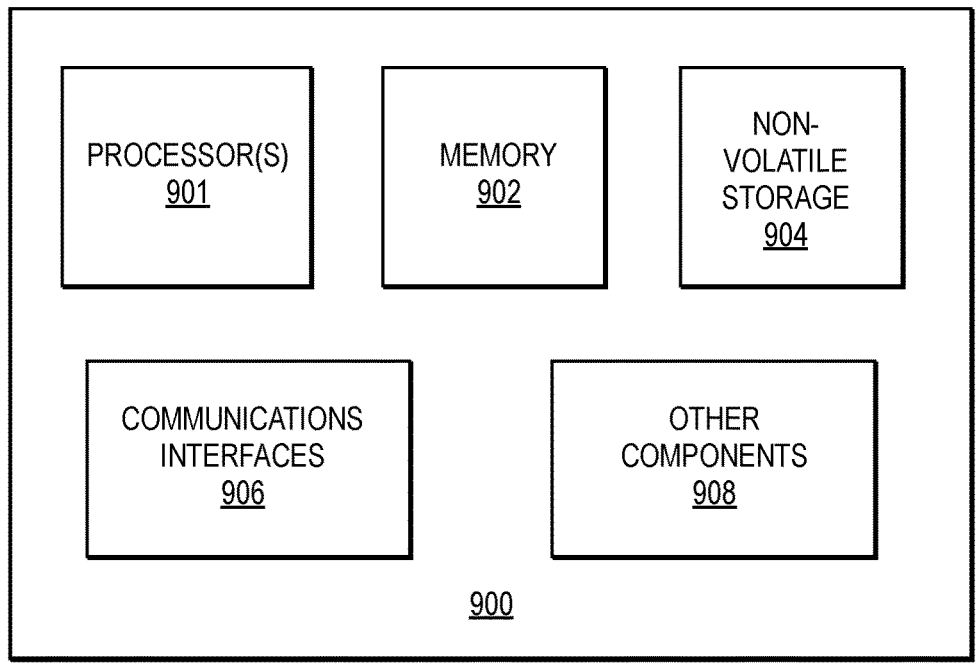
FIG. 9 provides an exemplary depiction of a computing system in which program suspend and resume techniques can be implemented.

FIG. 9 provides an exemplary depiction of a computing system 900 (e.g., a smartphone, a tablet computer, a laptop computer, a desktop computer, a server computer, etc.). As observed in FIG. 9, the system 900 may include one or more processors or processing units 901. The processor(s) 901 may include one or more central processing units (CPUs), each of which may include, e.g., a plurality of general-purpose processing cores. The processor(s) 901 may also or alternatively include one or more graphics processing units (GPUs) or other processing units. The processor(s) 901 may include memory management logic (e.g., a memory controller) and I/O control logic. The processor(s) 901 can be similar to, or the same as, the processors 352 of FIG. 3.

The system 900 also includes memory 902 (e.g., system memory), non-volatile storage 904, communications interfaces 906, and other components 908, which may also be similar to, or the same as, components of the host 350 of FIG. 3. The other components may include, for example, a display (e.g., touchscreen, flat-panel), a power supply (e.g., a battery or/or other power supply), sensors, power management logic, or other components. The communications interfaces 906 may include logic and/or features to support a communication interface. For these examples, communications interface 906 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 904, which may be the mass storage component of the system. The non-volatile storage 904 can be similar to, or the same as, the memory device 300 of FIG. 3, described above. Non-volatile storage 904 may include byte or block addressable types of non-volatile memory having a 3-dimensional (3D) cross-point memory structure that includes chalcogenide phase change material (e.g., chalcogenide glass) hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 904 may include mass storage that is composed of one or more SSDs. SSDs can be composed of flash memory chips that are capable of implementing program suspend and resume techniques as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile memory device comprising:
an array of non-volatile memory cells;
control circuitry to suspend a program operation to program cells of the array; and
a timer to track a duration of time the program operation is suspended;
the control circuitry to resume the program operation with a next program voltage based on the duration of time the program operation is suspended.

2. The non-volatile memory device of claim 1, wherein:
the timer is to start to track the duration in response to receipt of a signal indicating a program suspend; and
the timer is to stop to track the duration in response to receipt of a signal indicating a program resume.

3. The non-volatile memory device of claim 1, wherein:
the control circuitry is to determine the next program voltage based further on a pre-suspend program voltage.

4. The non-volatile memory device of claim 3, wherein:
the control circuitry is to determine the next program voltage based on the pre-suspend program voltage minus a voltage based on the duration of time the program operation is suspended.

5. The non-volatile memory device of claim 3, wherein:
the control circuitry is to determine the next program voltage as: the pre-suspend program voltage plus a voltage step based on cell state minus a voltage based on the duration of time the program operation is suspended.

6. The non-volatile memory device of claim 1, wherein:
the non-volatile memory device comprises a solid state drive (SSD).

7. The non-volatile memory device of claim 1, wherein the array comprises a NAND flash memory array.

8. The non-volatile memory device of claim 1, wherein the control circuitry and the array of non-volatile memory cells communicate over an Open NAND Flash Interface (ONFI) interface.

9. An apparatus, comprising:
a host comprising a processor and a solid state drive (SSD) interface; and
a solid state drive (SSD) coupled with the host via the SSD interface of the host, the solid state drive including:
an array of non-volatile memory cells;
control circuitry to suspend a program operation to program cells of the array; and
a timer to track a duration of time the program operation is suspended;
the control circuitry to resume the program operation with a next program voltage based on the duration of time the program operation is suspended.

10. The apparatus of claim 9, wherein:
the timer is to start to track the duration in response to receipt of a signal indicating a program suspend; and
the timer is to stop to track the duration in response to receipt of a signal indicating a program resume.

11. The apparatus of claim 9, wherein:
the control circuitry is to determine the next program voltage based further on a pre-suspend program voltage.

12. The apparatus of claim 11, wherein:
the control circuitry is to determine the next program voltage based on the pre-suspend program voltage minus a voltage based on the duration of time the program operation is suspended.

13. The apparatus of claim 11, wherein:
the control circuitry is to determine the next program voltage as: the pre-suspend program voltage plus a voltage step based on cell state minus a voltage based on the duration of time the program operation is suspended.

14. The apparatus of claim 9, wherein the array comprises a NAND flash memory array.

15. The apparatus of claim 9, wherein the control circuitry and the array of non-volatile memory cells communicate over an Open NAND Flash Interface (ONFI) interface.

16. The apparatus of claim 9, wherein the SSD interface comprises a Non-Volatile Memory Express (NVMe) interface.

17. An article of manufacture comprising a computer readable storage medium having content stored thereon which when accessed causes one or more processors to execute operations to perform a method comprising:
sending, from control circuitry of an SSD, a suspend command to a nonvolatile memory to suspend a program operation;
starting a timer circuit in response to the suspend command;
sending a resume command to the nonvolatile memory;
stopping the timer circuit in response to the resume command;
determining a time between the suspend command and resume command; and
resuming the program operation with a program voltage adjusted based on the time.

18. The article of manufacture of claim 17, the method further comprising:
determining the program voltage based further on a pre-suspend program voltage.

19. The article of manufacture of claim 18, the method further comprising:
determining the program voltage based on the pre-suspend program voltage minus a voltage based on a duration of the time.

20. The article of manufacture of claim 19, the method further comprising:
determining the pre-suspend program voltage based on a verify operation after the resume command.

* * * * *